United States Patent
Nakatsuka et al.

[11] Patent Number: 5,942,185
[45] Date of Patent: Aug. 24, 1999

[54] LEAD-FREE SOLDER USED FOR CONNECTING ELECTRONIC PARTS ON ORGANIC SUBSTRATE AND ELECTRONIC PRODUCTS MADE USING SAME

[75] Inventors: Tetsuya Nakatsuka, Yokohama; Tasao Soga, Fujisawa; Hanae Shimokawa, Kamakura; Kenichi Yamamoto; Masahide Harada, both of Yokohama; Yuuji Ochiai, Tokyo; Tsuneaki Kamei, Kanagawa-ken, all of Japan

[73] Assignee: Hitachi, Ltd., Tokyo, Japan

[21] Appl. No.: 08/963,119

[22] Filed: Oct. 28, 1997

Related U.S. Application Data

[63] Continuation of application No. 08/539,870, Oct. 6, 1995, abandoned.

[30] Foreign Application Priority Data

Oct. 11, 1994 [JP] Japan .................................. 6-245048
Aug. 9, 1995 [JP] Japan .................................. 7-203054

[51] Int. Cl.$^6$ .............................. B23K 35/22; G01N 25/00
[52] U.S. Cl. ...................... 420/562; 420/557; 420/561; 228/903
[58] Field of Search .................................. 420/557, 561, 420/562; 228/903

[56] References Cited

FOREIGN PATENT DOCUMENTS

| 48-39693 | 9/1973 | Japan . |
| 62-35876 | 8/1987 | Japan . |
| 3-128192 | 5/1991 | Japan . |
| 7-51883 | 2/1995 | Japan . |

*Primary Examiner*—Sikyin Ip
*Attorney, Agent, or Firm*—Antonelli, Terry, Stout & Kraus, LLP

[57] ABSTRACT

Provided is a lead-free solder for connecting LSI and parts on organic substrates, which can provide soldering at a maximum temperature of 220°–230° C. and which has a sufficient reliability in mechanical strength even at a high temperature of 150° C. Also provided are electronic products prepared using this lead-free solder. The lead-free solder has a solder composition including 3–5% Zn and 10–23% Bi, the balance being Sn. Preferably, the solder composition is a composition (Sn, Zn, Bi) surrounded by lines connecting A and B, B and C and C and A, where A is (85, 5, 10), B is (72, 5, 23) and C is (76, 3, 21), of a ternary diagram having pure Sn, pure Zn and pure Bi at the vertices of an equilateral triangle. Through use of this solder, it is possible to solder parts, etc. on conventionally employed organic substrates at reflow temperatures equivalent to those for conventional Pb—Sn eutectic solders. The solder does not damage the environment, can be stably supplied and is low in cost.

13 Claims, 6 Drawing Sheets

PARENTHESIZED NUMERALS REPRESENT DIFFERENCE
BETWEEN LIQUIDUS AND SOLIDUS TEMPERATURES

LEAD-FREE SOLDER USED FOR CONNECTING ELECTRONIC PARTS ON ORGANIC SUBSTRATE AND ELECTRONIC PRODUCTS MADE USING SAME

This application is a Continuation application of Ser. No. 08/539,870 filed Oct. 6, 1995, now abandoned.

BACKGROUND OF THE INVENTION

1. Field of the Invention

The present invention relates to a Pb-free solder which is usable as a substitute for the conventional Pb—Sn eutectic solders used at a soldering temperature of 220–230° C. for connecting LSI, parts, etc. on organic substrates and which has a sufficient reliability in mechanical strength even at a high temperature of 150° C., and to an electronic product made using the solder.

2. Description of Related Art

Most of the generally used substrates for printed circuit boards are made of glass fabric based-epoxy (hereinafter referred to as merely "glass-epoxy"). The maximum heat resisting temperature of glass-epoxy substrates is 220–230° C. when a reflowing furnace is used. The solders used for connecting electronic parts on the substrates are Pb-63% Sn eutectic solders (melting point: 183° C.) or solders having near the eutectic composition. Since melting point of these solders is about 183° C., they can perform sufficient connection at a temperature lower than the heat resisting temperature of general-purpose glass-epoxy substrates (230° C.). Furthermore, as for the reliability of mechanical strength at high temperatures, a mechanical strength up to 150° C. at the maximum can be guaranteed.

Recently, it has been reported that in U.S.A., printed circuit boards used for electronic parts are exposed to the weather, and lead (Pb) contained in the solders readily reacts with acids (accelerated by acid rain) and dissolves in underground water, which exerts a bad influence upon human bodies when it is used as drinking water. Under the circumstances, as soldering alloys free from Pb to be substituted for the Pb alloys, alloys of Sn, Zn, Bi, etc. have been noticed as the suitable alloys which exert less influence upon environment, have less toxicity on human bodies, have less problems of draining of resources, have less problems in cost, and have been actually used as materials. As binary solders, Sn-3.5% Ag (melting point: 221° C.) and Sn-5% Sb (melting point: 240° C.) have already been actually used as Pb-free solders. However, these cannot be used for soldering on glass-epoxy substrates because of their too high melting point. Sn-9% Zn (eutectic of 199° C. in melting point) has a lower melting point, but the surface is very susceptible to oxidation and is considerably inferior to Sn—Ag and Sn—Sb alloys in wettability with Cu or Ni. Further, the melting point is not so low as electronic parts being able to be reflowed onto generally used glass-epoxy substrates at 220–230° C. It is empirically known that the soldering temperature is higher 30–50° C. than the melting point of solders. For example, in the case of Pb-63% Sn eutectic solder (melting point: 183° C.), the standard maximum reflow temperature in the furnace is 220° C. The difference between the melting point and the soldering temperature is 37° C. In the case of wave soldering which is carried out in a short time, the standard maximum temperature is 235° C. The temperature difference is 52° C. When wettability is poor, this temperature difference must be larger. When an Sn-9% Zn solder is used, it is known that it hardly wets at a reflow temperature of 230° C. even if generally employed rosin fluxes (chlorine content: 0.2%) are used.

Furthermore, there are Sn—Bi based solders (typical composition: Sn-58% Bi; melting point: 138° C.) and Sn—In based solders (typical composition: Sn-52% In; melting point: 117° C.), but high-temperature strength at 150° C. of these solders cannot be guaranteed. Therefore, these compositions cannot be said to be substitute for Pb-63% Sn eutectic solders, and development of new soldering materials in new combinations satisfying the demands has been desired.

Ternary solders comprising Sn—Zn—Bi as main components are hopeful from the point of melting point. The Sn—Zn—Bi solders are disclosed in JP 57-11793(A) and 59-18906(A).

JP 57-11793(A) proposes low-melting point solders for Al which comprises 5–10% of Zn and 8–13% of Bi, the balance being Sn, and which is excellent in corrosion resistance. These are solders for Al aiming at improvement of strength at low temperatures and not for connection to printed circuit boards having Cu conductors. Furthermore, since they contain more than 5% of Zn and are vigorously oxidized to form a strong oxide film, the oxide film cannot be reduced with low-activity fluxes (rosin type) which are generally employed for the connection of electronic parts. Accordingly, those fluxes which contain organic acids or inorganic or strong active agents must be used. Use of such high performance fluxes for connecting electronic parts causes corrosion due to the remaining flux. For example, for the connection of connector pins, the flux entering inside the connector cannot be removed by cleansing and remains as a residue, which causes corrosion of conductor portions. Therefore, as a package, a flux containing up to 0.2% of chlorine has generally been used. If fluxes of the higher performance are used, there may be the problems such as corrosion with the fluxes remaining even after cleansing, occurrence of migration and deterioration of electric insulation characteristics, and such fluxes are not used at present.

JP 59-189096(A) proposes solder alloys which comprise 5–15% of Zn and 3–20% of Bi, the balance being Sn, aiming at improvement of strength in connecting wires. The alloys used in Examples have high melting points and cannot be said to have solder compositions with which reflowing can be carried out at lower than 230° C. which the glass-epoxy substrates can stand. Furthermore, since they contain more than 5% of Zn and undergo considerable oxidation to form a strong oxide film, the oxide film cannot be reduced with the low performance fluxes (rosin type) which are generally employed for the connection of electronic parts. Accordingly, high performance fluxes must be used. However, use of such high performance fluxes for connecting electronic parts causes problems such as corrosion with the remaining fluxes and deterioration of electric insulation characteristics, and such fluxes cannot be used.

SUMMARY OF THE INVENTION

The object of the present invention is to mount, with high reliability, electronic parts such as LSI, parts, etc. on conventional organic substrates such as glass-epoxy substrates using a solder as a substitute for Pb—Sn eutectic solders without using Pb in such a manner that a sufficient wettability with Cu conductors and terminals of parts plated with Sn-based solders can be secured and flowing or reflowing can be carried out using low performance fluxes at 230° C. or lower. Therefore, the first task is to provide a solder having such a melting point that the solidus temperature is 160° C. or higher, preferably 170° C. or higher (it is also necessary to stand the use at a high temperature of 150° C.)

and the liquidus temperature is 195° C. or lower, preferably 190° C. or lower (if the liquidus temperature is higher than this temperature, the soldering temperature rises to exert a thermal influence upon the substrate and the parts). The wettability can be secured to some extent by metallization with terminals, but in order to inhibit deterioration of wettability due to the properties of the solder per se, it is necessary to keep content of Zn inferior in wettability in the materials to a minimum. However, if Zn is not added, the liquidus temperature does not decrease greatly and, therefore, the composition must be determined with keeping a balance with wettability. When 9% of Zn is added to Sn, the minimum liquidus temperature is 199° C. As mentioned above, in this case, the melting point is still high and the wettability is too poor.

DETAILED DESCRIPTION OF PREFERRED EMBODIMENTS

Figure 2:
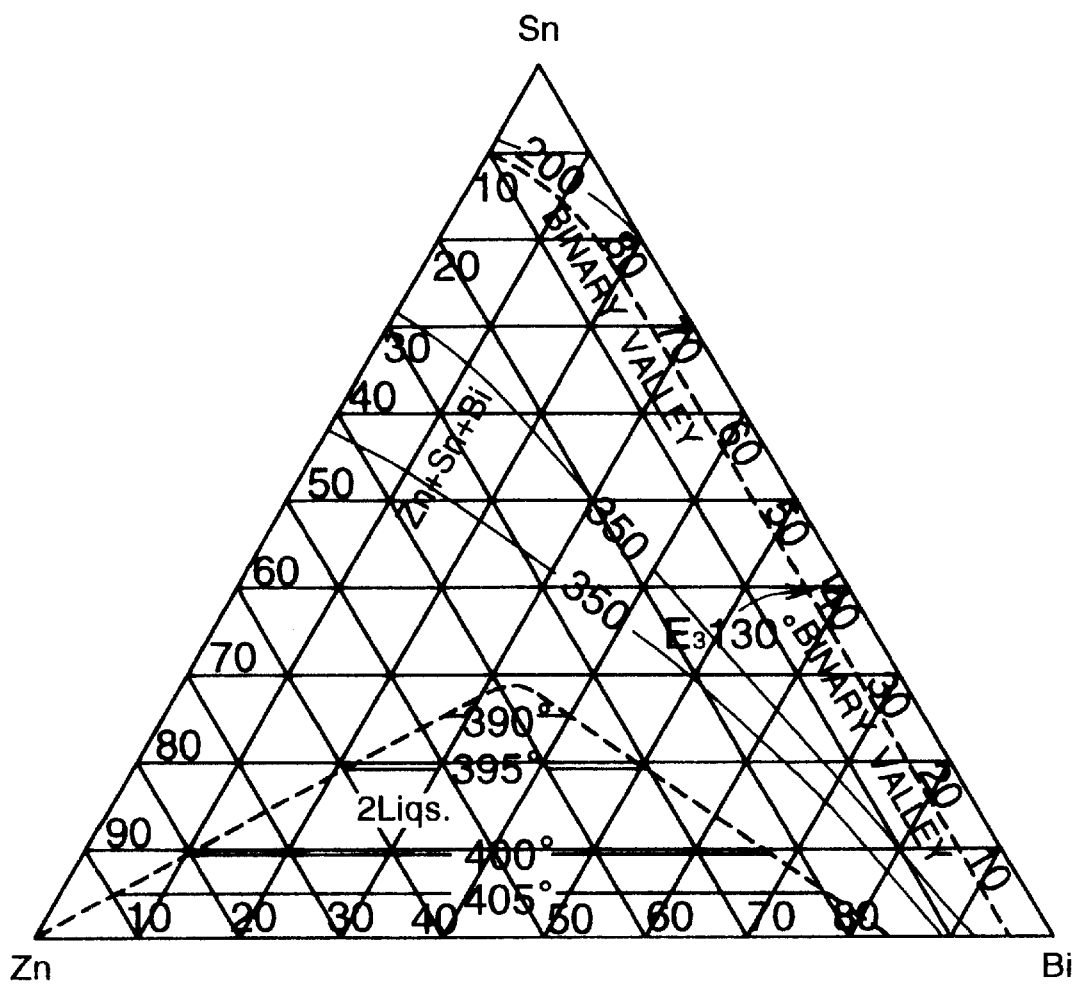
FIG. 2 is a known phase diagram which shows the liquidus temperature of a Sn—Zn—Bi solder.

For attaining the above object, the inventors have conducted an investigation on Pb-free alloys comprising a ternary system of Sn—Zn—Bi which exert little influence upon environment, have little toxicity, have no problems of exhaustion of resources, have reduced melting points, and can secure the wettability. Details of phase diagrams of the ternary solders are unknown, and only the outline of the melting point (liquidus temperature) is known as shown in FIG. 2. Therefore, it has been necessary to elucidate the relation between the melting point (solidus temperature, liquidus temperature) and the composition and the relations between the composition and wettability, properties and mechanical characteristics. The solder for connection on organic substrates according to the present invention is characterized by comprising an Sn—Zn— Bi based alloy consisting essentially of 3–5% of Zn and 10–23% of Bi, the balance being Sn, optionally with at least one of In, Ag, Sb and Cu to improve wettability and mechanical properties.

The reason for limiting the composition of the solder as above will be explained below.

When the content of Zn is less than 3%, the liquidus temperature is high and, therefore, connection at lower than 230° C. is difficult to perform. When it is more than 5%, the surface of the solder is strongly oxidized and, hence, wettability cannot be secured with use of generally employed fluxes for soldering of electronic parts. Therefore, the inventors have attempted to bring the melting point near to the target temperature range by adding Bi as a third element which can reduce the melting point and is satisfactory in environmental problems, resources, actual usability and cost. On the binary eutectic line of Sn—Zn, Zn is in the range of 4–5% when Bi is in the range of 11–23%. Deviation from the binary eutectic line shows the great temperature difference of liquidus and solidus, and this is not the preferable state for connection. When the content of Zn is in the range of 3–5%, the solder is not affected so strongly by the oxidation with Zn, and wettability can be secured to a certain extent. In addition, the composition having the melting point and wettability at which electronic parts can be mounted on an organic substrate can be found.

When the content of Bi is less than 10%, since the liquidus temperature is higher than 200° C., it is difficult to perform a connection at 220–230° C. When the content of Bi is more than 23%, the solidus temperature lowers to near 150° C. and the solder per se loses ductility. Therefore, it is difficult to secure the margin of reliability at high temperatures, and mechanical characteristic also deteriorate. In order that the solder can stand the accelerated heat cycle test at −55–150° C., a solidus temperature of at least 160° C. is necessary.

EXAMPLES

The present invention will be explained in more detail by the following examples.

Figure 1:
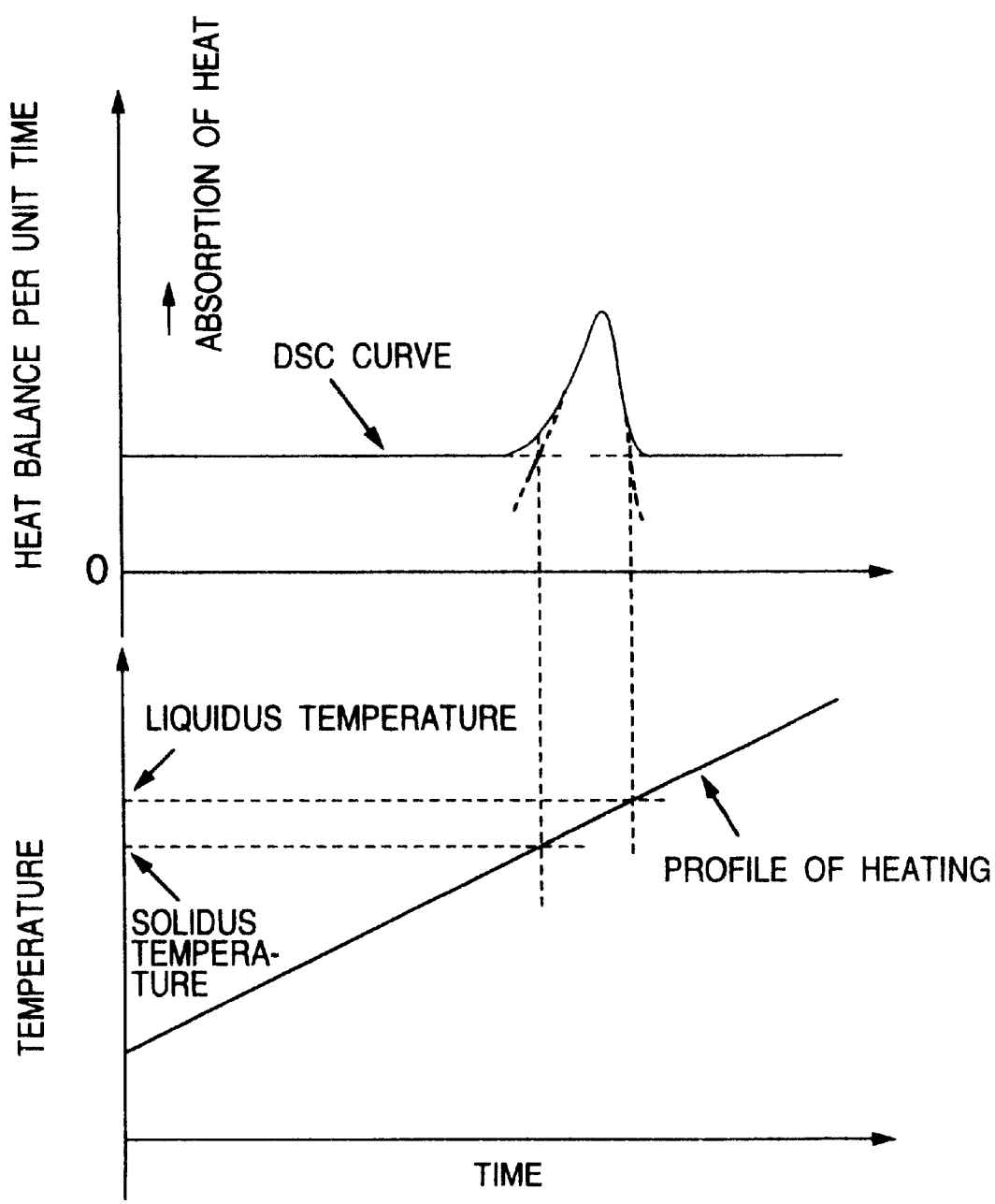
FIG. 1 shows a DSC curve used for the determination of the melting point of the solder.

Table 1 shows solidus temperatures and liquidus temperatures of the investigated compositions of the Sn—Zn—Bi solders according to the present invention. The melting point (liquidus temperature, solidus temperature) is measured using DSC at a heating rate of 2° C./min. The liquidus temperature and the solidus temperature are the temperatures of the points at which the tangent lines drawn from the peak of the obtained DSC curve toward the high temperature part and the low temperature part intersect the extension lines of the flat portions of the curve as shown in FIG. 1, respectively.

TABLE 1

| No. | Composition (wt. %) | | | Solidus temperature (° C.) | Liquidus temperature (° C.) |
| --- | --- | --- | --- | --- | --- |
|  | Sn | Zn | Bi |  |  |
| 1 | Balance | 1 | 24 | 134 | 203 |
| 2 | " | 3 | 10 | 175 | 207 |
| 3 | " | " | 11 | 173 | 208 |
| 4 | " | " | 13 | 171 | 203 |
| 5 | " | " | 15 | 168 | 202 |
| 6 | " | " | 17 | 165 | 198 |
| 7 | " | " | 19 | 164 | 195 |
| 8 | " | " | 22 | 160 | 191 |
| 9 | " | " | 23 | 159 | 190 |
| 10 | " | " | 25 | 155 | 187 |
| 11 | " | 4 | 13 | 173 | 193 |
| 12 | " | " | 15 | 170 | 195 |
| 13 | " | " | 17 | 166 | 194 |
| 14 | " | " | 19 | 165 | 190 |
| 15 | " | " | 22 | 161 | 185 |
| 16 | " | " | 23 | 159 | 184 |
| 17 | " | " | 24 | 134 | 183 |
| 18 | " | 5 | 10 | 179 | 195 |
| 19 | " | " | 11 | 178 | 194 |
| 20 | " | " | 13 | 172 | 194 |
| 21 | " | " | 15 | 170 | 193 |
| 22 | " | " | 17 | 169 | 189 |
| 23 | " | " | 19 | 165 | 186 |
| 24 | " | " | 23 | 160 | 181 |
| 25 | " | " | 25 | 136 | 179 |

Figure 3:
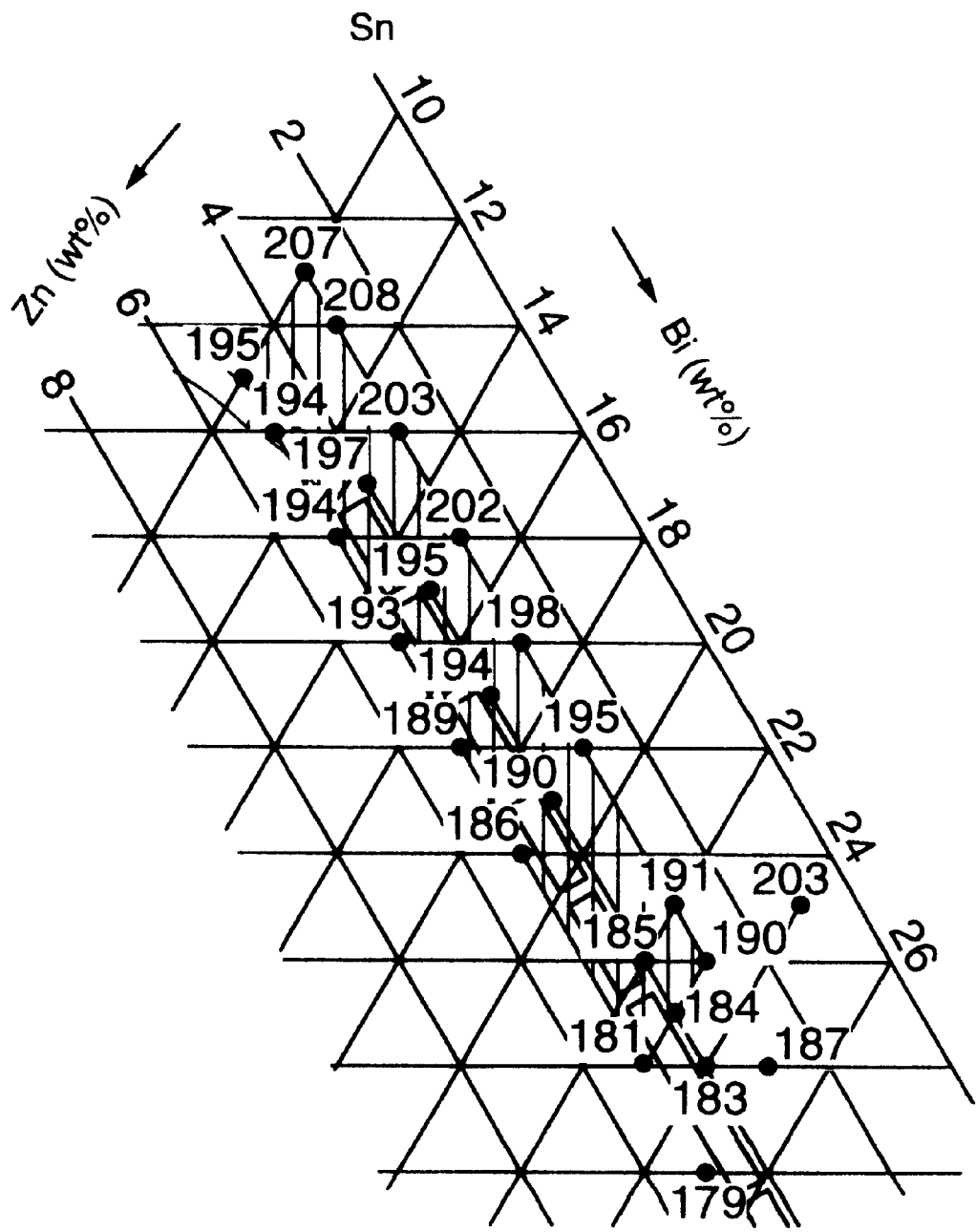
FIG. 3 is a phase diagram which shows the liquidus temperature of the Sn—Zn—Bi solder comprising 3–5 wt % of Zn and 10–25 wt % of Bi.
Figure 4:
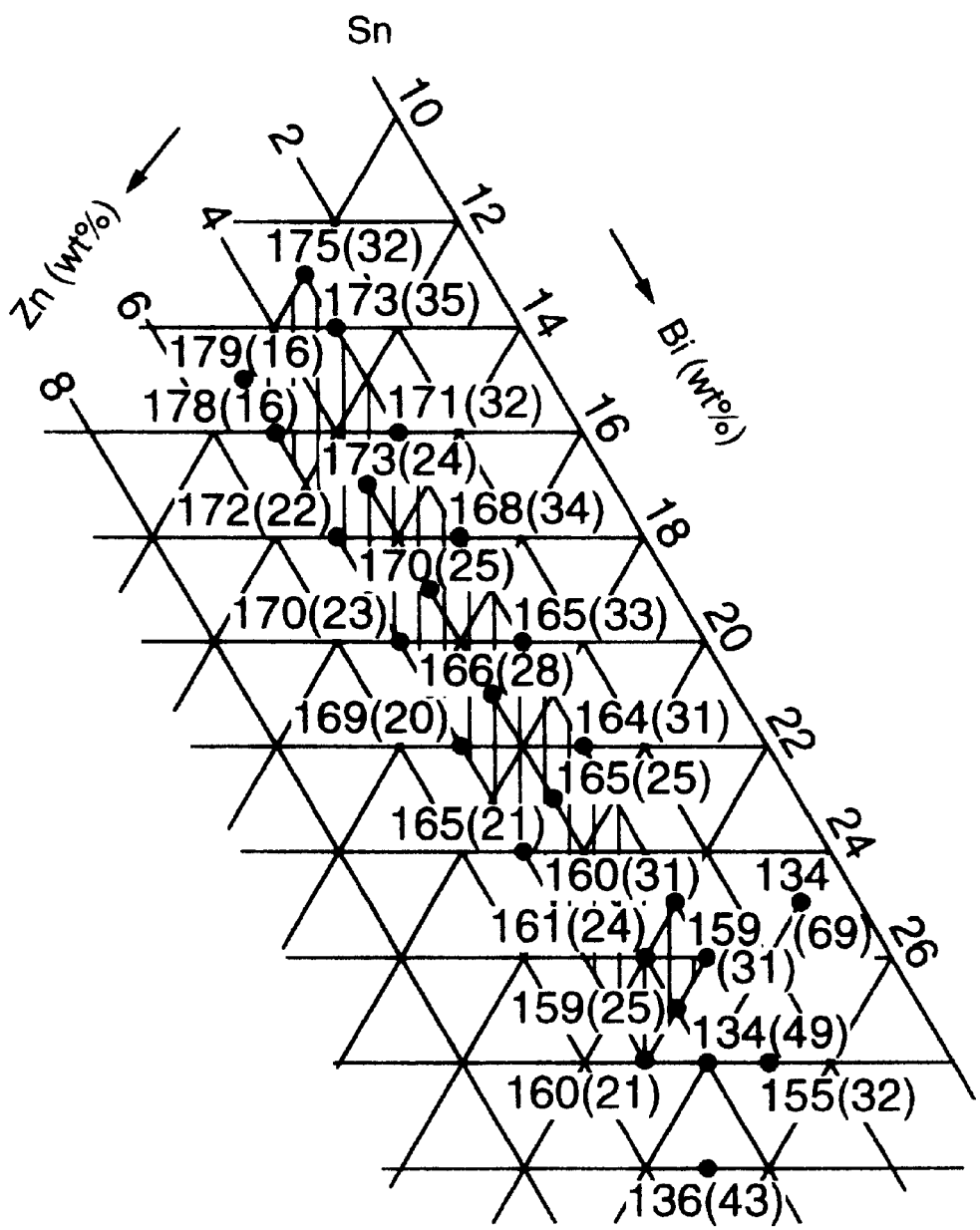
FIG. 4 is a phase diagram which shows the solidus temperature and the temperature difference between the liquidus temperature and the solidus temperature of the Sn—Zn—Bi solder comprising 3–5 wt % of Zn and 10–25 wt % of Bi.

FIG. 2 is a known phase diagram of Sn—Zn—Bi ternary solders [International Critical Tables, 2 (1927), 418]. An overall rough distribution of the melting point (liquidus temperature) can be known, but detailed distribution and definite temperatures are not known at present. That is, the relation between the liquidus temperature and the solidus temperature is not clear. Therefore, liquidus temperatures and solidus temperatures of the compositions narrowed down to those of the needed melting point region have been investigated and the results are shown in FIGS. 3 and 4. FIG. 3 shows the liquidus temperatures of Table 1 by enlarging the range of FIG. 2. It is recognized from the thermal analysis curve that binary valley of Sn—Zn system (the flow is shown by a wide broken line) passes through the range of Zn content of 4–5% when the Bi content is in the range of 11–23%. As for the lower limit of the Bi content, when it is less than 10%, the liquidus temperature of the binary valley is higher than 195° C. and soldering on glass-epoxy substrates is difficult, and, therefore, 10% is taken as the lower limit. FIG. 4 shows solidus temperatures of Table 1 of the same compositions as in FIG. 3. The numerical value in the parentheses in FIG. 4 shows the temperature difference between the liquidus temperature (FIG. 3) and the solidus temperature. It is generally considered that the smaller temperature difference is desirable for soldering. It has been found that the solidus temperature is within the desired range in the range of the smaller Bi content, but when the Bi content is more than 23%, it is below 160° C. It has been further found that there is a point at which the solidus temperature lowers to near 130° C. when the Bi content is 24% or more. It is considered that this is because when the Bi content is 24% or more, a phase having a composition close to the Sn—Zn—Bi ternary eutectic composition of low melting point is precipitated. Therefore, the upper limit of Bi content is determined to be 23%. As can be seen from FIGS. 2, 3 and 4, change of the melting point with change of the Zn content is conspicuous, and when the Zn content is less than 3%, the liquidus temperature exceeds 200° C. in the range of the smaller Bi content (less than 16%). Furthermore, when the Zn content is less than 3%, the difference between the liquidus temperature and the solidus temperature increases irrespective of the Bi content (FIG. 4) and this is not preferred from the viewpoint of connection. When the Zn content is 3%, the liquidus temperature is lower than 187° C. even when the Bi content is less than 25%, and since the melting point must be lower than 187° C, it is a necessary condition that the Zn content is 3% or more. On the other hand, when the Zn content is more than 5%, the difference between the liquidus temperature and the solidus temperature decreases, and this is preferred from the viewpoint of connection. However, oxidation with Zn becomes conspicuous to deteriorate wettability, and the solder is not practical for connection of electronic parts. Furthermore, from the aspect of melting point, when Zn content is more than 5%, since the melting point exceeds the binary valley, the liquidus temperature is in the course of rising and the composition cannot be said to have the merit over the solder containing 3–5% of Zn. Moreover, growth of an alloy layer with Cu is great to cause brittleness, and, thus, the content of Zn is desirably 5% or less. Therefore, a proper range of the Zn content is 3–5%. However, when the Zn content is 5%, an oxide film tends to be formed and this is not preferred. The above are results obtained by carrying out an investigation from the aspects of melting point and soldering conditions, and it has been found as a result of investigation from the aspect of wettability that the wettability also decreases in proportion to the degree of oxidation. That is, with increase of Zn content, the wettability decreases. Therefore, the smaller Zn content is preferred from the point of wettability.

Figure 5:
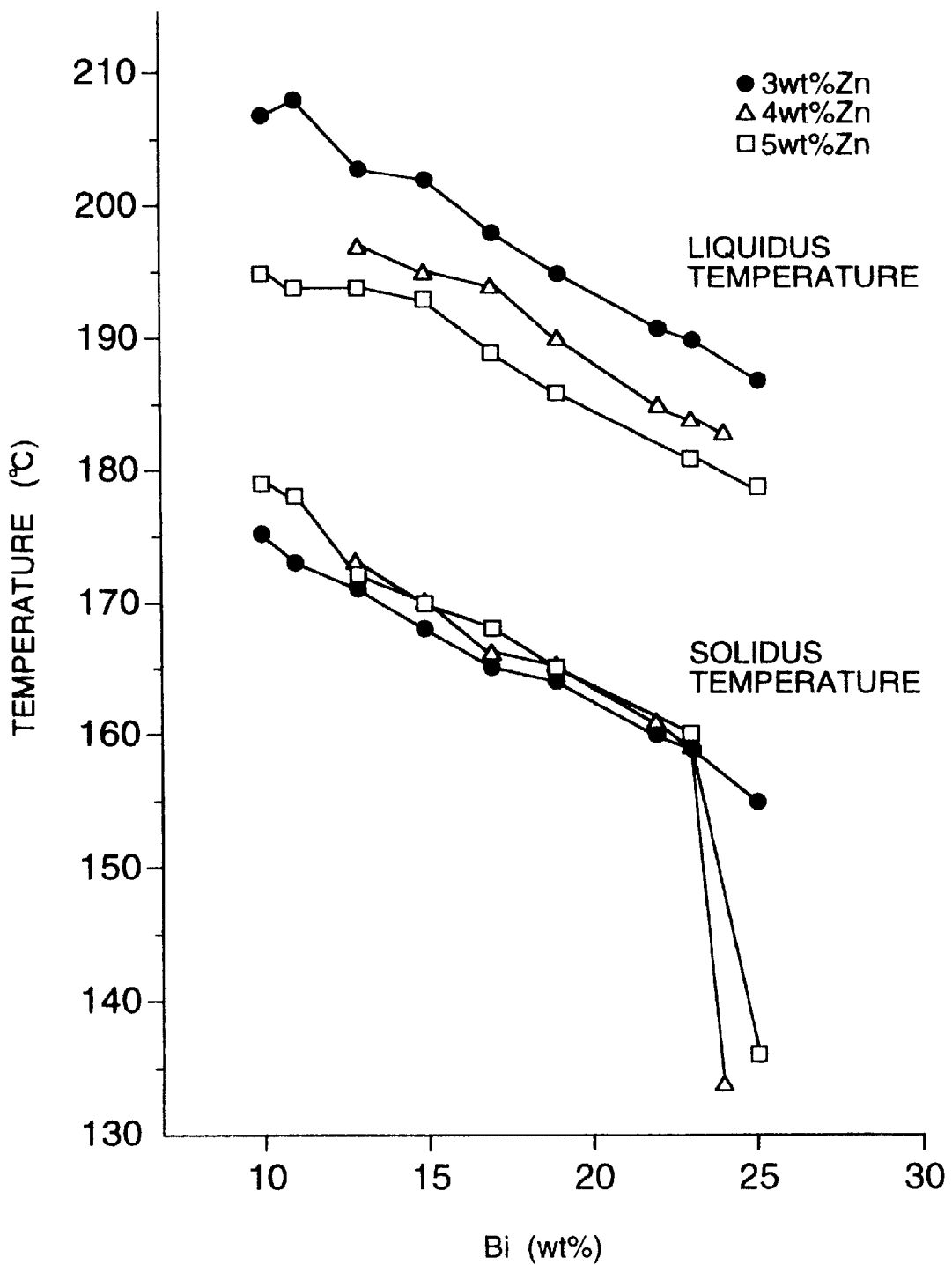
FIG. 5 is a graph which shows the relations between the liquidus temperature and the content of Bi and between the solidus temperature and the content of Bi in the Sn—Zn—Bi solder with the varied contents of Zn of 3 wt %, 4 wt % and 5 wt %.

FIG. 5 is a graph which shows the relation between the liquidus temperature and the solidus temperature, taking temperature on the ordinate axis and Bi content (wt %) on the abscissa axis. In general, the difference between the liquidus temperature and the solidus temperature is preferably as small as possible. Since the maximum soldering temperature is determined to be 220–230° C., the margin of reliability at high temperatures expands with decrease in the difference between the liquidus temperature and the solidus temperature. From FIG. 5, the relation between the liquidus temperature and the solidus temperature when the Zn content is 3, 4 and 5% can be known. It can be seen that the solidus temperature does not so greatly depend upon the Zn content up to near 23% of Bi content, and with increase in the Bi content, the solidus temperature lowers. However, when the Bi content exceeds 23%, the solidus temperature tends to lower abruptly. The Bi content in which the solidus temperature does not lower below 160° C. is in the range of 23% or less when Zn content is in the range of 3–5%. The liquidus temperature also lowers with increase of the Bi content, but it depends also greatly upon the Zn content, and with increase of the Zn content to 3, 4 and 5%, the liquidus temperature lowers, and the difference between the liquidus temperature and the solidus temperature decreases. Although not shown in FIG. 5, since it has become clear by thermal analysis that the straight line part of the binary eutectic line passes between the Zn contents of 4% and 5%, when the Zn content is a value between 4% and 5% (near 5%), the liquidus temperature lowers below that when the Zn content is 3, 4 and 5%, and the difference between the liquidus temperature and the solidus temperature further decreases and this is a preferable condition from the viewpoint of connection. When the Zn content is small, the joint strength decreases, but the fact is that improvement of the strength is required not so much from the point of reliability of joints of electronic parts. [In this respect, see, for example, Soga's, "Reliability of Soldered Joints" in journal of Printed Circuit Society, Vol.7, No.2 (1992)]. Sn—Zn—Bi based solders generally have the properties of high strength at high temperatures (creep resistance, etc.), excellent thermal fatigue resistance and good balancing. After all, the solders of Nos.1, 10, 17 and 25 in Table 1 are outside the scope of the present invention.

Next, the wettability of the solder with Cu terminals of printed circuit boards was evaluated at a reflow temperature of 220° C. at the maximum. The flux used was a rosin containing 0.2% of chlorine. It was found that the wettability decreased with increase of Zn content. Similarly, influence of Bi content on wettability was evaluated to find that the wettability decreased with increase of the Bi content, but this was not so conspicuous as in the case of change in Zn content. Thus, the results are obtained that the wettability greatly depends on the Zn content and a wettability necessary for connection can be obtained with a Zn content of 5% or less.

Figure 6:
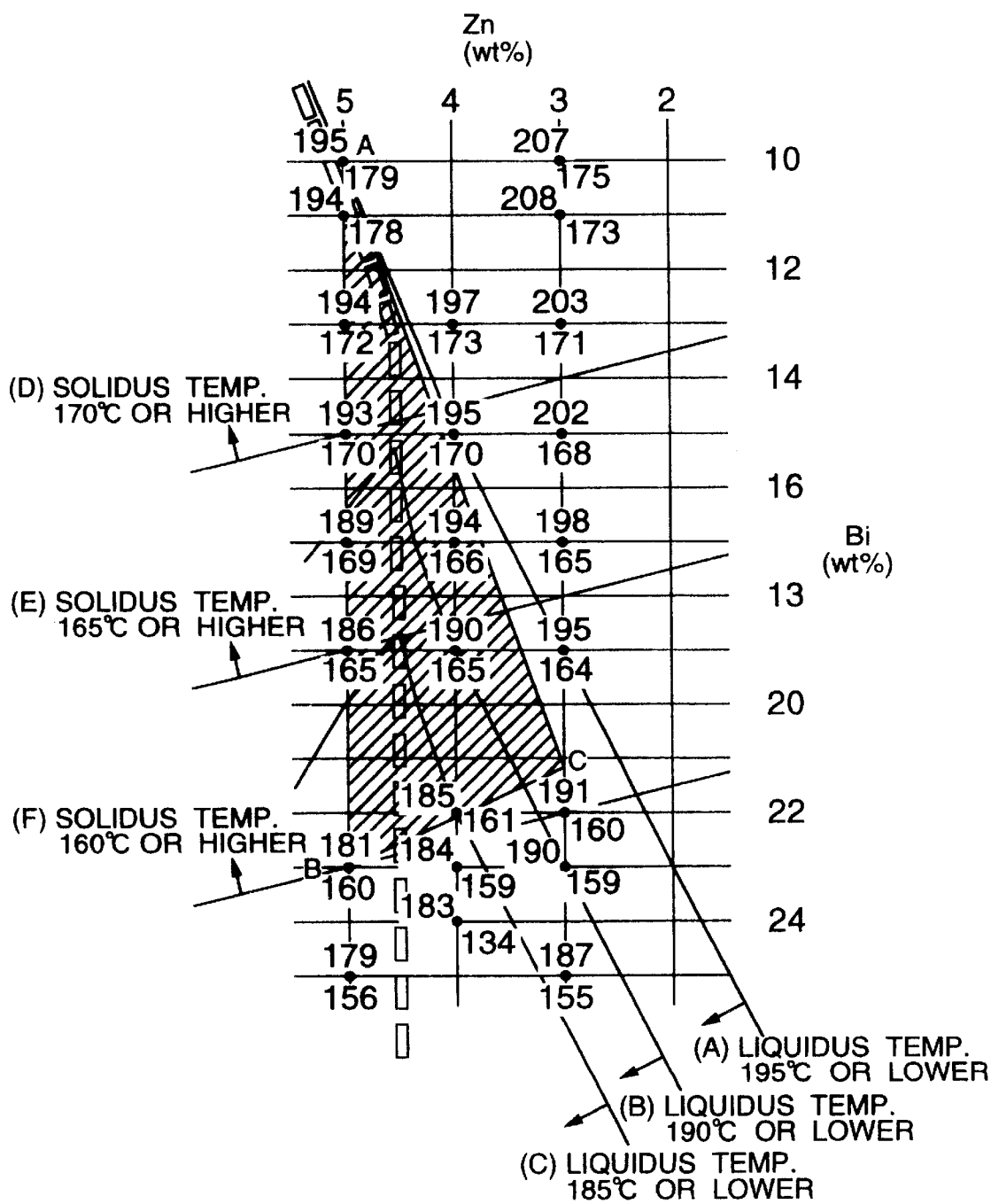
FIG. 6 is a graph which shows the dependence of the liquidus temperature and the solidus temperature on the contents of Zn and Bi.

In FIG. 6, the Zn content is taken on the abscissa axis and Bi content is taken on the ordinate axis, and liquidus (195° C. (a), 190° C. (b), 185° C. (c)) and solidus (160° C. (d), 165° C. (e), 170° C. (f)) are parameters. This is considered to be a special case where isothermal lines of the liquidus temperature and the solidus temperature intersect. The liquidus temperature and the solidus temperature at the composition of the intersecting point are shown at the upper row and the lower row, respectively. Since the soldering is carried out at 220° C., the liquidus temperature must be 195° C. at the highest. The solidus temperature must be 160° C. at the lowest in order to secure the reliability at a high temperature of 150° C. When the Zn content is large, wettability is deteriorated and oxidation vigorously takes place. Therefore, the Zn content is 5% or less. When the Bi content is more than 23%, a new solid phase appears at a further lower temperature of 135° C., and, in addition, the solder becomes brittle to cause deterioration of elongation, and such solder is not preferred for a joint. Therefore, the compositional range surrounded by A (85, 5, 10), B (72, 5, 23) and C (76, 3, 21) which include the above contents is determined to be a more preferred range.

The area surrounded by AB (Zn: 5%), the liquidus (a) and the solidus (f) provides the composition which satisfies a liquidus temperature of 195° C. or lower and a solidus temperature of 160° C. or higher in the range of the Zn content of 5% or less. The area surrounded by AB, the liquidus (b) and the solidus (e) provides the composition which satisfies a liquidus temperature of 190° C. or lower and a solidus temperature of 165° C. or higher in the range of Zn content of 5% or less. Similarly, the area surrounded by AB, the liquidus (c) and the solidus (e) provides the composition which satisfies a liquidus temperature of 185° C. or lower and a solidus temperature of 165° C. or higher in the range of the Zn content of 5% or less. Among these compositions, a composition of 4.5Zn—76.5Sn—19Bi can be considered as a composition having a liquidus temperature of about 185° C. and a solidus temperature of 165° C. or higher with a smaller Bi content. This composition was evaluated on wettability and strength.

A sample was prepared by applying an Sn plating of 10 $\mu$m thick onto Cu pads of a glass-epoxy substrate. A solder having the above composition was formed into balls of about 50 $\mu$m in diameter and, then, pasted. The paste was applied onto the pads at a thickness of about 180 $\mu$m by printing using a high performance flux in the paste. Thereon was mounted a QFP-LSI (pitch 0.5 mm). An Sn plating of 8 $\mu$m was applied to 42 alloy leads of LSI. The oxide film on the surface of Sn was reduced with chlorine in the flux by carrying out reflowing at 230° C. and the solder spread with wetting. When Sn—Bi plating is applied in place of the Sn plating, the melting point lowers and the wetting and spreading can be accelerated. Since the thickness of plating was less than 10 $\mu$m, the melting point is hardly affected by the change of the whole composition. Furthermore, when a thin Ni—Au plating is applied onto the Cu pads and the 42 alloy leads, since the surface is not readily oxidized, a construction excellent in wetting and spreading can be obtained only by breaking the oxide film on the surface of the solder.

An Sn plating (or an Sn—Bi plating) of 2 $\mu$m was applied onto balls (average diameter 50 $\mu$m) for paste of solder having a composition of 76.5Sn—4.5Zn—19Bi (liquidus temperature 185° C. and solidus temperature 165° C.). By carrying out such surface treatment, the solder inside began to melt at 165° C. just before soldering and the Sn plating began to dissolve into the inside solder. At 185° C., the solder melted and the surface Sn (or Sn—Bi) completely dissolved into the solder and, at the same time, melted with the adjacent solder balls. At this time, the component of Zn also appeared on the surface, but Zn was not oxidized because of the $N_2$ atmosphere, and wettability on the substrate pads and the terminals of parts in the flux could be secured. The $SnO_2$ film of the Sn plating on the substrate pads and the terminals of parts was reduced with chlorine in the flux, and reflowing could be carried out at the maximum temperature of 230° C. Since amount of Sn on the substrate and the terminals of parts was smaller as compared with the amount of the solder in the paste, the Sn content increased only about 1%. Therefore, the melting point of the final solder composition was substantially the same as that of the paste solder. On the other hand, 3% of In was added to 84Sn—5Zn—11Bi solder which had relatively high liquidus temperature and solidus temperature in the composition claimed in the present invention, thereby to lower the liquidus temperature and the solidus temperature, and this was used for preparing a paste. The addition of In improved the wettability and mechanical properties of materials. Addition of In in a large amount was apt to cause corrosion and, further, led to increase in cost. Therefore, In was added in the necessary and minimum amount.

Next, in order to inhibit oxidation of the surface of solder with Zn, solder balls of 50 $\mu$m in average diameter which was plated with Sn at a thickness of 2–5 $\mu$m were prepared and pasted. The flux was a rosin containing 0.2% of chlorine. The surface Sn plating began to melt with the inside solder at 170° C. which exceeds the solidus temperature in a reflowing furnace of $N_2$ atmosphere and they were completely mixed together at 185° C. It was confirmed that the component of Zn was also exposed on the surface, but was not oxidized due to the $N_2$ atmosphere, and the solder easily wetted and spread on the Cu terminals and the terminals of parts at the maximum temperature of 230° C.

As explained above, the Sn—Zn—Bi solders of the present invention are not harmful to environment, being different from Pb, can be stably supplied from resources without exhaustion and with low cost, and can connect electronic parts, etc. onto the conventionally employed glass-epoxy substrate at a reflow temperature similar to that for conventional Pb—Sn eutectic solders by the same reflow apparatus as conventionally employed. The solders of the present invention have high strength, and especially, are excellent in strength at high temperatures and creep strength. As joints, they also have thermal fatigue strength equal to that of conventional Pb—Sn eutectic solders.

In the above explanation, the glass-epoxy substrates are mainly used, but it is natural that the present invention can also be applied to other heat resistant substrates such as glass-polyimide substrates, BT (glass fabric-based bismaleimide.triazine) substrates, and ceramic substrates. Moreover, in flow soldering, there may be used paper-epoxy substrates, paper-phenol substrates, composite substrates, etc. which are low in heat resistance.

What is claimed is:

1. A lead-free solder for connection of electronic parts on organic substrates which consists essentially of at least 3%, but less than 5%, of Zn and 10–23% of Bi, the balance being Sn, the lead-free solder having a liquidus temperature of at most 195° C. and a solidus temperature of at least 160° C.

2. A lead-free solder according to claim 1 which is in the form of a paste.

3. A lead-free solder for connection of electronic parts on organic substrates which consists essentially a composition (Sn, Zn, Bi) in an area surrounded by lines respectively connecting A and B, B and C and C and A, where A is (85, 5, 10), B is (72, 5, 23) and C is (76, 3, 21) of a triangular coordinate diagram putting pure Sn, pure Zn and pure Bi respectively at vertices of an equilateral triangle, excluding compositions where Zn is 5, the lead-free solder having a liquidus temperature of at most 195° C. and a solidus temperature of at least 160° C.

4. A lead-free solder according to claim 3 which is in the form of a paste.

5. A lead-free solder according to claim 1 or 3 wherein the liquidus temperature of at most 190° C. and a solidus temperature of at least 165° C.

6. A lead-free solder according to any one of claims 1–4 which consists of the Sn, Zn and Bi.

7. An electronic product comprising an electronic part having leads, an organic substrate having a copper wiring formed thereon, and a solder connecting the leads of said electronic part to said copper wiring on said organic substrate, wherein said solder is said lead-free solder according to any one of claims 1–4.

8. An electronic product produced by mounting an electronic part on an organic substrate using a lead-free solder which consists essentially of at least 3%, but less than 5%, of Zn and 10–23% of Bi, the balance being Sn, the lead-free solder having a liquidus temperature of at most 195° C. and a solidus temperature of at least 160° C.

9. An electronic product produced by mounting an electronic part on an organic substrate using a lead-free solder which consists essentially of a composition (Sn, Zn, Bi) in an area surrounded by lines respectively connecting A and B, B and C and C and A, where A is (85, 5, 10), B is (72, 5, 23) and C is (76, 3, 21) of a triangular coordinate diagram putting pure Sn, pure Zn and pure Bi respectively at vertices of an equilateral triangle, excluding compositions where Zn is 5, the lead-free solder having a liquidus temperature of at most 195° C. and a solidus temperature of at least 160° C.

10. An electronic product according to claim 8 or 9 wherein the organic substrate is glass-epoxy substrate.

11. An electronic product according to claims 8 or 9 wherein the lead-free solder consists of the Sn, Zn and Bi.

12. An electronic product according to claims 8 or 9 wherein the organic substrate is selected from the group consisting of glass-epoxy substrate, paper-epoxy substrate, paper-phenol substrate, glass-polyimide substrate, ceramic substrate and glass fabric-based bismaleimide-triazine substrate.

13. An electronic product according to any one of claims 8, 9 and 10 wherein the liquidus temperature is at most 190° C. and the solidus temperature is at least 165° C.

* * * * *